(12) United States Patent
Cheng et al.

(10) Patent No.: US 9,412,692 B2
(45) Date of Patent: Aug. 9, 2016

(54) FLEXIBLE MICROSYSTEM STRUCTURE

(71) Applicant: Winbond Electronics Corp., Taichung (TW)

(72) Inventors: Yu-Ting Cheng, New Taipei (TW); Yu-Min Fu, Taoyuan (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/596,079

(22) Filed: Jan. 13, 2015

(65) Prior Publication Data

US 2016/0204051 A1  Jul. 14, 2016

(51) Int. Cl.
*H01L 29/15* (2006.01)
*H01L 23/498* (2006.01)
*H01L 23/00* (2006.01)

(52) U.S. Cl.
CPC ...... *H01L 23/4985* (2013.01); *H01L 23/49811* (2013.01); *H01L 23/49816* (2013.01); *H01L 23/49827* (2013.01); *H01L 23/49838* (2013.01); *H01L 23/562* (2013.01); *H01L 24/09* (2013.01); *H01L 24/17* (2013.01); *H01L 2224/08225* (2013.01); *H01L 2224/08238* (2013.01); *H01L 2224/16227* (2013.01); *H01L 2924/1511* (2013.01); *H01L 2924/15159* (2013.01); *H01L 2924/351* (2013.01)

(58) Field of Classification Search
CPC .............. H01L 23/4985; H01L 23/562; H01L 23/49827; H01L 24/09; H01L 24/17; H01L 23/49838; H01L 23/49811; H01L 21/49816; H01L 2224/16227; H01L 2224/08238; H01L 2924/15159; H01L 2924/1511; H01L 2924/03
See application file for complete search history.

(56) References Cited

U.S. PATENT DOCUMENTS

| 6,312,614 | B1 | 11/2001 | Arimitsu et al. | |
| 2004/0175862 | A1* | 9/2004 | Tao | H01L 23/36 438/106 |
| 2005/0245060 | A1* | 11/2005 | Chiu | H01L 23/3677 438/612 |
| 2012/0291275 | A1 | 11/2012 | Rha et al. | |
| 2012/0300419 | A1 | 11/2012 | Tang et al. | |

FOREIGN PATENT DOCUMENTS

TW   201203197 A   1/2012

* cited by examiner

*Primary Examiner* — Roy Potter
*Assistant Examiner* — Paul Patton
(74) *Attorney, Agent, or Firm* — Muncy, Geissler, Olds & Lowe, P.C.

(57) ABSTRACT

A flexible microsystem structure is provided. The flexible microsystem structure includes a flexible substrate; and a chip disposed over the flexible substrate, wherein the chip is bonded to the flexible substrate by a plurality of bonding elements disposed over the flexible substrate; wherein the flexible substrate has at least one trench disposed under the chip and disposed along at least one side of at least one of the bonding elements.

13 Claims, 8 Drawing Sheets

FLEXIBLE MICROSYSTEM STRUCTURE

BACKGROUND

1. Technical Field

The disclosure relates to a microsystem structure, and in particular to a flexible microsystem structure.

2. Description of the Related Art

Flexible electronic technology has become more and more important in recent years. This technology may broaden the applicable fields of electronic products, which were based on silicon in the past. Since a flexible electronic product is flexible, thin and cost-effective, it is applicable in an environment where the flexible electronic product needs to be bent or curved. Therefore, a flexible electronic product has a broader field of application.

However, in the manufacture of a flexible microsystem structure, a flexible substrate would be heated in the bonding step to bond the flexible substrate to the chip, which in turn results in thermal stress. Thermal stress can result in inflatedness, bending and curving of the flexible substrate after the flexible substrate is bonded to the chip. Therefore, the flexible microsystem structure needs to be improved further.

SUMMARY

The present disclosure provides a flexible microsystem structure, including: a flexible substrate; and a chip disposed over the flexible substrate, wherein the chip is bonded to the flexible substrate by a plurality of bonding elements disposed over the flexible substrate; wherein the flexible substrate has at least one trench disposed under the chip and disposed along at least one side of at least one of the bonding elements.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The flexible microsystem structure of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition of this specification, expressions such as "first insulating bump disposed on/over a second material layer", may indicate not only the direct contact of the first insulating bump and the second material layer, but also, a non-contact state with one or more intermediate layers between the first insulating bump and the second material layer. In the above situation, the first insulating bump may not directly contact the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate not only that the layer directly contacts the other layer, but also that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean+/− 20% of the stated value, more typically +/−10% of the stated value and even more typically +/−5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless defined otherwise, all technical and scientific terms used herein have the same meaning as commonly understood to one of ordinary skill in the art to which this invention belongs. It should be appreciated that, in each case, the term, which is defined in a commonly used dictionary, should be interpreted as having a meaning that conforms to the relative skills and the background or the context of the present disclosure, and should not be interpreted in an idealized or overly formal manner unless defined otherwise.

The present disclosure utilizes a trench which is disposed beside the bonding element and is disposed in the flexible substrate to release the thermal stress of the flexible substrate, which in turn reduces the inflatedness, bending and curl of the flexible substrate resulted after the heating step.

Figure 1:
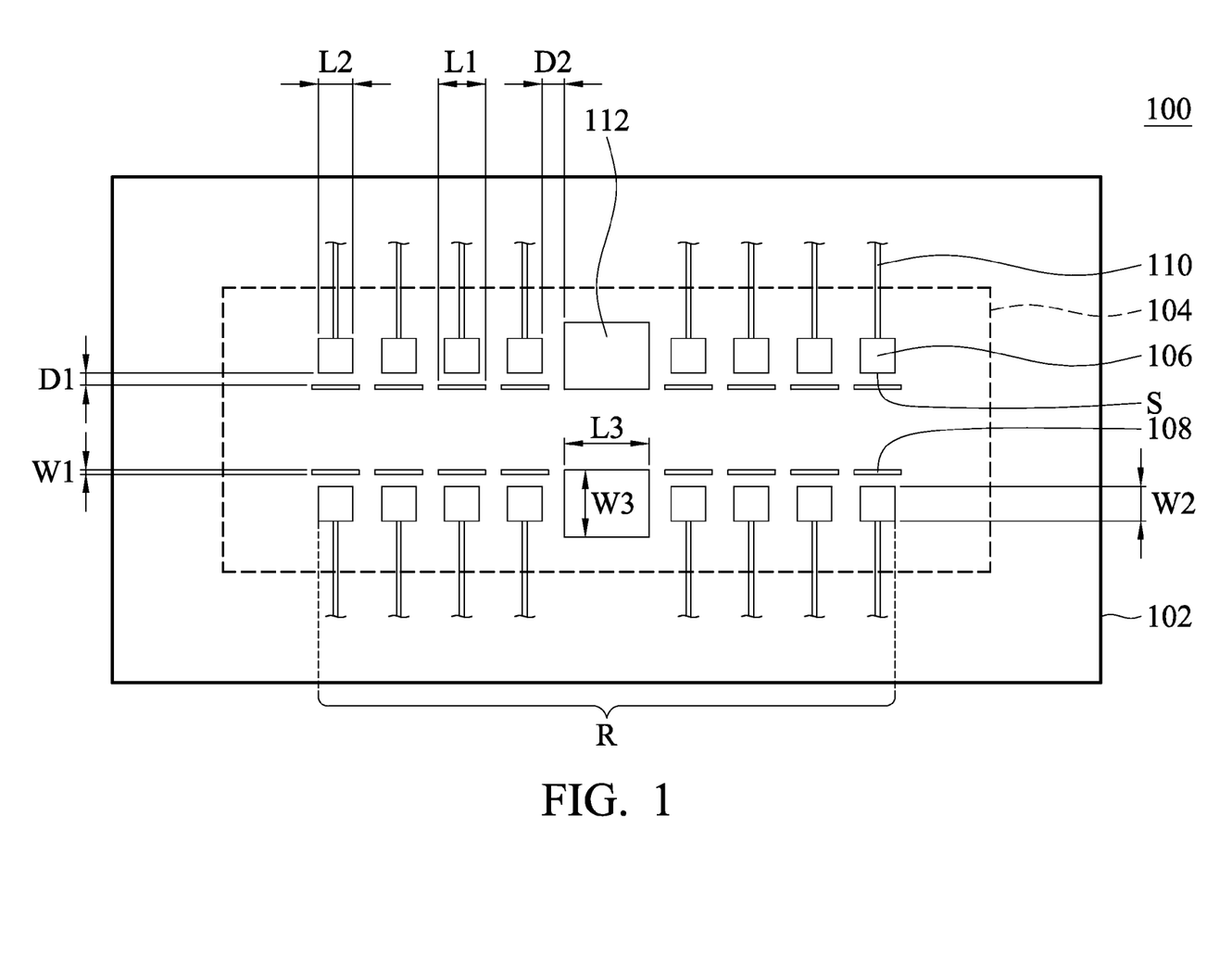
FIG. 1 is a top view of a flexible microsystem structure in accordance with some embodiments of the present disclosure.

FIG. 1 is a top view of a flexible microsystem structure 100 in accordance with some embodiments of the present disclosure. As shown in FIG. 1, the flexible microsystem structure 100 includes a flexible substrate 102 and a chip 104 disposed over the flexible substrate 102. The chip 104 is bonded to the flexible substrate 102 by a plurality of bonding elements 106 disposed over the flexible substrate 102. It should be noted that the elements or devices disposed under the chip 104 such as the bonding elements 106 and the subsequent trenches 108 are shown in FIG. 1. In addition, the chip 104 is shown by dashed line for the sake of brevity.

Still referring to FIG. 1, the flexible substrate 102 has at least one trench 108 disposed under the chip 104. In addition, the trench 108 is disposed along at least one side S of at least one of the bonding elements 106. Since the thermal stress of the flexible microsystem structure 100 is arisen mainly at the bonding portion of the flexible substrate 102 and the chip 104, namely the place where the bonding elements 106 are located. Therefore, by disposing the trench 108 in the flexible substrate 102 and along the side S of the bonding elements 106, the present disclosure may release the thermal stress caused by the different thermal expansion coefficients of the flexible substrate 102 and the chip 104 in the heating steps. Therefore, the inflatedness, bending and curl of the flexible substrate 102 that can result after the heating steps may be reduced.

The flexible substrate 102 may include, but is not limited to, any elastic, flexible, bendable or extendable material. For example, the material of the flexible substrate 102 may include, but is not limited to, polymers, plastics, flexible glass or any other suitable flexible material. For example, in one embodiment, the flexible substrate 102 may be manufactured by hard baking the commercial products SU-8 (for example baking at 200° C. for 2 hours).

The chip 104 may include any semiconductor chip such as memory. The memory may include, but is not limited to, Static Random Access Memory (SRAM), Low Power Single-Data-Rate synchronous dynamic random-access memory (LPSDR SDRAM), low-power double-data-rate synchronous dynamic random-access memory (LPDDR SDRAM), synchronous dynamic random-access memory (SDRAM), double-data-rate synchronous dynamic random-access memory (DDR SDRAM), parallel flash memory, or serial flash memory. In addition, the memory may also include, but is not limited to, optoelectronics, MEMS, microfluidic systems, physical sensors, light emitting diodes, solar cells, RF components, accelerometers, gyroscopes, micro-actuator, surface acoustic wave elements, a pressure sensor, an ink jet head, a power MOS field-effect transistor module, or any other similar elements.

The bonding element 106 may include, but is not limited to, a conductive pad, a conductive pillar, a conductive bump, a solder ball, or any other suitable bonding element. The material of the bonding element 106 may include, but is not limited to, a single layer or multiple layers of conductive metal material, conductive metal compound material, or a combination thereof. The conductive metal material may include, but is not limited to, Al, Cu, Au, W, Mo, Ti, Pt, Ir, Ni, Cr, Ag, Rh, or alloy thereof. The conductive metal compound material may include, but is not limited to, compound of Al, Cu, Au, W, Mo, Ti, Pt, Ir, Ni, Cr, Ag, Mg, Rh, or a combination thereof.

In addition, as shown in FIG. 1, the plurality of the bonding elements 106 may be juxtaposed with each other. In other words, the bonding elements 106 may be disposed side by side or may be disposed in rows. However, it should be noted that the configuration of the bonding elements 106 is not limited to that in FIG. 1. For example, although FIG. 1 shows only two bonding element rows R disposed under the chip 104 and eight bonding elements 106 in each bonding element row R, those skilled in the art will appreciate that more than two bonding element rows R may be disposed under the chip 104, and the number of bonding elements 106 in each of the bonding element row R may be something other than eight. Therefore, the exemplary embodiment set forth in FIG. 1 is merely for the purpose of illustration, and the inventive concept may be embodied in various forms without being limited to the exemplary embodiment as shown in FIG. 1.

Still referring to FIG. 1, the bonding elements 106 may be electrically connected to another chip (not shown) or an external circuit (not shown) by wires 110. The material of the wires 110 may include that of the bonding elements 106 mentioned above. The material of the wires 110 may be the same as or different from that of the bonding elements 106.

Still referring to FIG. 1, in the embodiment shown in this figure, the flexible substrate 102 has a plurality of the trenches 108, and the plurality of trenches 108 are disposed along only one side S of each of the bonding elements 106. As shown in FIG. 1, for one bonding element row R, the trenches 108 are disposed along only one side S of the bonding elements 106 in this bonding element row R. The trench 108 may be formed by laser cutting, photolithography and etching steps, wheel cutting, mechanical drilling, or any other suitable method, or a combination thereof. In one embodiment, the photolithography steps may include resist patterning. The resist patterning may include steps such as resist coating, soft baking, mask alignment, pattern exposure, post-exposure baking, resist developing and hard baking. The etching step may include reactive ion etch (RIE), plasma etch, or any other suitable etching step.

In addition, the width W1 of the trench 108 may be about 0.1 to 0.3 times the width W2 of the bonding element 106, for example from about 0.15 to 0.25 times. It should be noted that, if the width W1 of the trench 108 is too great, for example greater than 0.3 times the width W2 of the bonding element 106, the trench 108 would occupy too much area of the flexible substrate 102 such that the structural stability of the flexible microsystem structure 100 would be reduced. However, if the width W1 of the trench 108 is too small, for example smaller than 0.1 times the width W2 of the bonding element 106, the trench 108 cannot effectively release the thermal stress resulted in due to the different thermal expansion coefficients of the flexible substrate 102 and the chip 104 in the heating steps.

In addition, the length L1 of the trench 108 may be about 0.8 to 1.5 times the length L2 of the bonding element 106, for example from about 1 to 1.3 times. It should be noted that, if the length L1 of the trench 108 is too great, for example greater than 1.5 times the length L2 of the bonding element 106, the trench 108 would occupy too much area of the flexible substrate 102 such that the structural stability of the flexible microsystem structure 100 would be reduced. However, if the length L1 of the trench 108 is too small, for example smaller than 0.8 times the length L2 of the bonding element 106, the trench 108 cannot effectively release the thermal stress resulted in due to the different thermal expansion coefficients of the flexible substrate 102 and the chip 104 in the heating steps.

In addition, the trench 108 is spaced apart from the bonding element 106 by a distance D1, the distance D1 may be about 0.2 to 0.5 times the width W2 of the bonding element 106, for example from about 0.3 to 0.4 times. It should be noted that, if the distance D1 is too great, for example greater than 0.5 times the width W2 of the bonding element 106, the trench 108 would be too far from the bonding element 106 such that the trench 108 cannot effectively release the thermal stress resulted in due to the different thermal expansion coefficients of the flexible substrate 102 and the chip 104 in the heating steps. However, if the distance D1 is too small, for example smaller than 0.2 times the width W2 of the bonding element 106, the trench 108 would be too close to the bonding element 106 such that the structural stability of the flexible microsystem structure 100 would be reduced. For example, in the subsequent embodiment shown in FIG. 7 with the trenches 108 disposed along four sides S of each of the bonding elements 106, if the trench 108 is too close to the bonding element 106, the flexible substrate 102 of the connecting portion would be easy to break.

In addition, in some embodiments, the trench 108 may partially extend into the flexible substrate 102. However, in other embodiments, the trench 108 may completely penetrate through the flexible substrate 102. This will be described in detail in the following FIGS. 5A-5B and description.

In addition, as shown in FIG. 1, the flexible substrate 102 may further include a through-hole 112 disposed between the pluralities of bonding elements 106. The through-hole 112 may further release the thermal stress resulted in due to the different thermal expansion coefficients of the flexible substrate 102 and the chip 104 in the heating steps. Therefore, the inflatedness, bending and curl of the flexible substrate 102 resulted after the heating steps may be further reduced.

The through-hole 112 may also be formed by laser cutting, photolithography and etching steps, wheel cutting, mechanical drilling, or any other suitable method, or a combination thereof as the trench 108. In addition, in some embodiments, the through-hole 112 may partially extend into the flexible substrate 102. However, in other embodiments, the through-hole 112 may completely penetrate through the flexible substrate 102.

As shown in FIG. 1, the length L3 of the through-hole 112 may be about 1 to 2 times the length L2 of the bonding element 106, for example from about 1.2 to 1.8 times. In addition, the width W3 of the through-hole 112 may be about 1 to 2 times the width W2 of the bonding element 106, for example from about 1.2 to 1.8 times. It should be noted that, if the length L3 or the width W3 of the through-hole 112 is too great, for example, if the length L3 is greater than 2 times the length L2 of the bonding element 106, or if the width W3 is greater than 2 times the width W2 of the bonding element 106, the through-hole 112 would occupy too much area of the flexible substrate 102 such that the structural stability of the flexible microsystem structure 100 would be reduced. However, if the length L3 or the width W3 of the through-hole 112 is too small, for example, if the length L3 is shorter than the length L2 of the bonding element 106, or if the width W3 is smaller than the width W2 of the bonding element 106, the through-hole 112 cannot effectively release the thermal stress resulted in due to the different thermal expansion coefficients of the flexible substrate 102 and the chip 104 in the heating steps.

In addition, the through-hole 112 is spaced apart from the bonding element 106 by a distance D2, the distance D2 may be about 0.5 to 0.8 times the length L2 of the bonding element 106, for example from about 0.6 to 0.7 times. It should be noted that, if the distance D2 is too great, for example greater than 0.8 times the length L2 of the bonding element 106, the through-hole 112 would be too far from the bonding element 106 such that the through-hole 112 cannot effectively release the thermal stress resulted in due to the different thermal expansion coefficients of the flexible substrate 102 and the chip 104 in the heating steps. However, if the distance D2 is too small, for example smaller than 0.5 times the length L2 of the bonding element 106, the through-hole 112 would be too close to the bonding element 106 such that the structural stability of the flexible microsystem structure 100 would be reduced.

Figure 2:
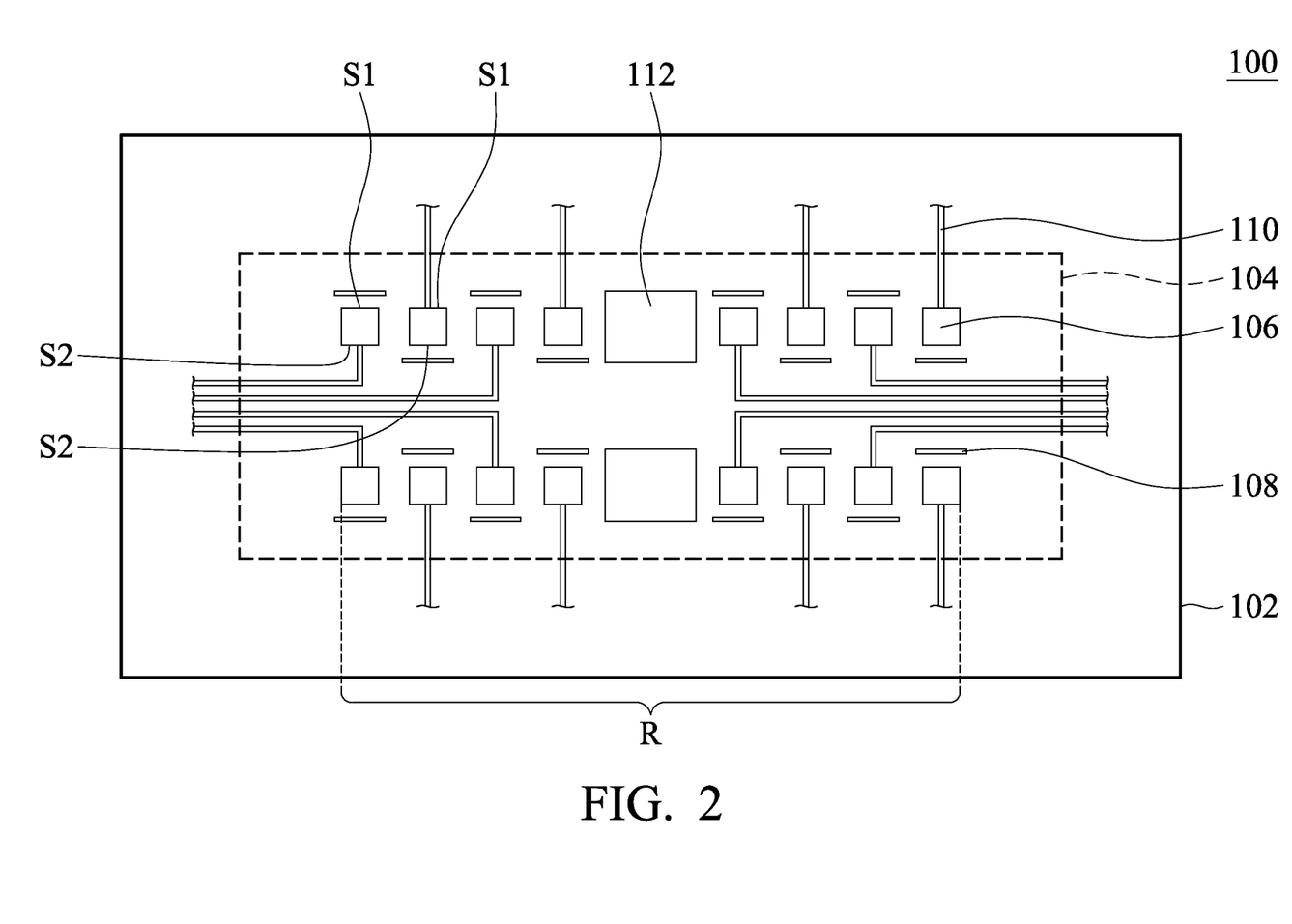
FIG. 2 is a top view of a flexible microsystem structure in accordance with another embodiment of the present disclosure.

FIG. 2 is a top view of a flexible microsystem structure in accordance with another embodiment of the present disclosure. The difference between the embodiment shown in FIG. 2 and the embodiment shown in FIG. 1 is that for one bonding element row R, the trenches 108 are alternatively disposed along the opposite sides S1 and S2 of the bonding elements 106 in this bonding element row R. Note that the same or like elements or layers corresponding to those of the flexible microsystem structure are denoted by like reference numerals. The same or like elements or layers denoted by like reference numerals has the same or similar materials, manufacturing processes and functions. These will not be repeated for the sake of brevity. In the embodiment shown in FIG. 2, the trenches 108 alternatively disposed along the opposite sides S1 and S2 of the bonding element row R may release the thermal stress around the bonding element row R more uniformly.

Figure 3:
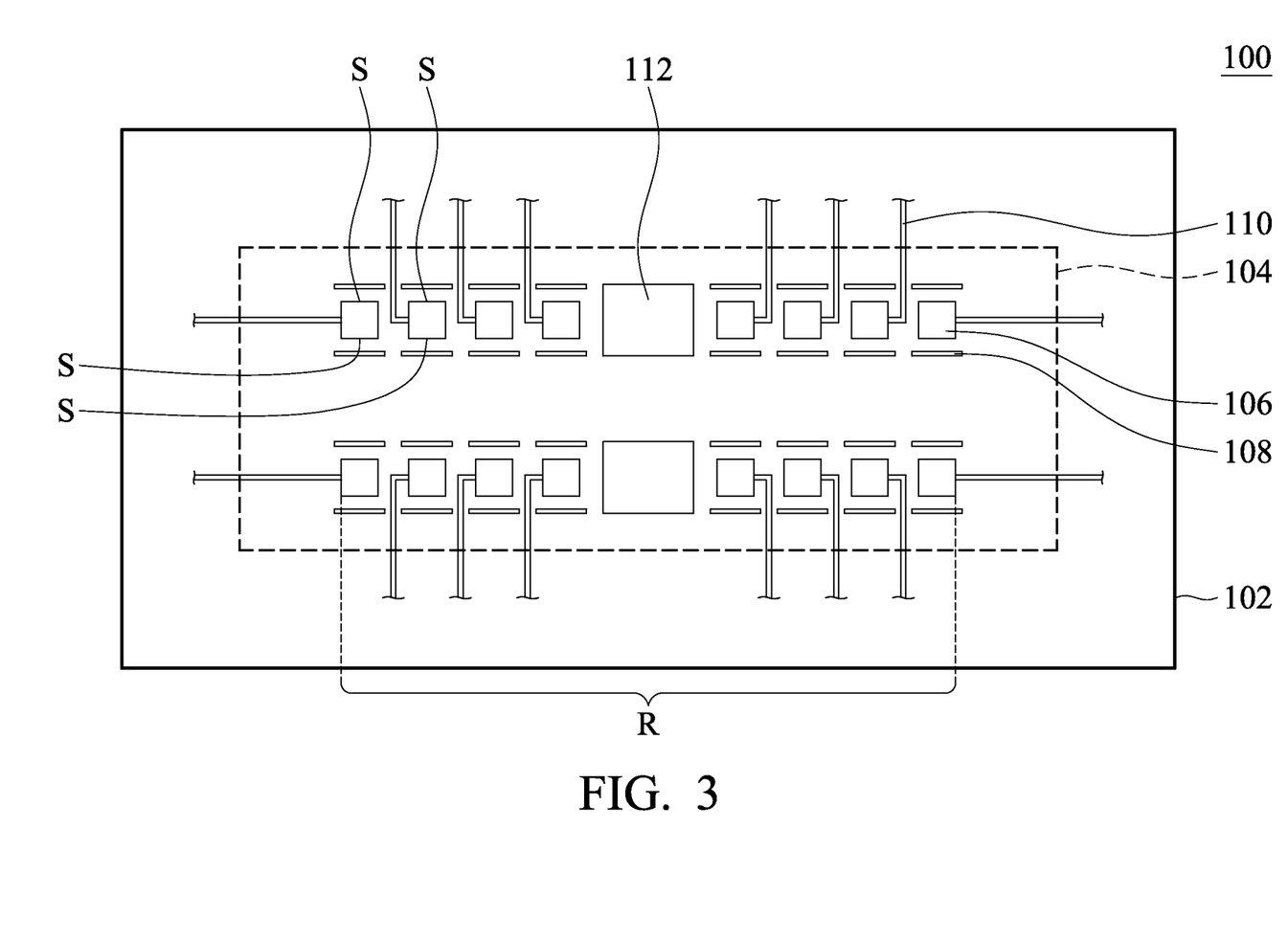
FIG. 3 is a top view of a flexible microsystem structure in accordance with another embodiment of the present disclosure.

FIG. 3 is a top view of a flexible microsystem structure in accordance with another embodiment of the present disclosure. The difference between the embodiment shown in FIG. 3 and the embodiments shown in FIGS. 1-2 is that the plurality of the trenches 108 are disposed along two sides S of each of the bonding elements 106, and is disposed along only these two sides S of each of the bonding elements 106. In addition, no trench 108 is disposed between the bonding elements 106. Since the amount of the trenches 108 around one bonding element 106 increases, the flexible microsystem structure 100 shown in FIG. 3 may further release the thermal stress resulted in due to the different thermal expansion coefficients of the flexible substrate 102 and the chip 104 in the heating steps. Therefore, the inflatedness, bending and curl of the flexible substrate 102 resulted after the heating steps may be further reduced.

Figure 4:
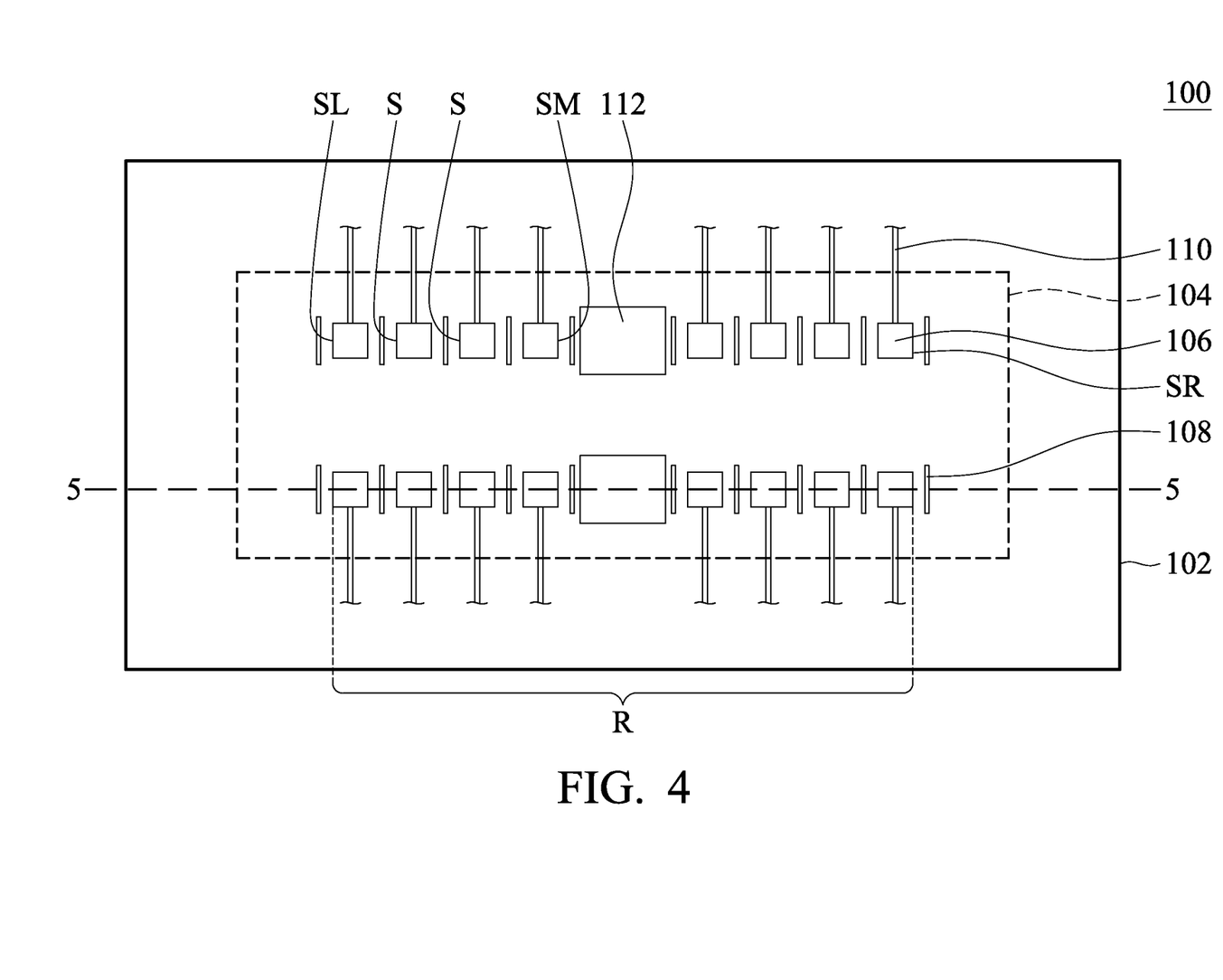
FIG. 4 is a top view of a flexible microsystem structure in accordance with another embodiment of the present disclosure.

FIG. 4 is a top view of a flexible microsystem structure in accordance with another embodiment of the present disclosure. The difference between the embodiment shown in FIG. 4 and the embodiment shown in FIG. 3 is that although the plurality of the trenches 108 are also disposed along two sides S of each of the bonding elements 106, the plurality of the trenches 108 are disposed between the bonding elements 106, disposed between the bonding element 106 and the through-hole 112 (namely disposed along the side SM), and disposed along the outer most sides SL and SR of each of the bonding element row R.

Figure 5A:
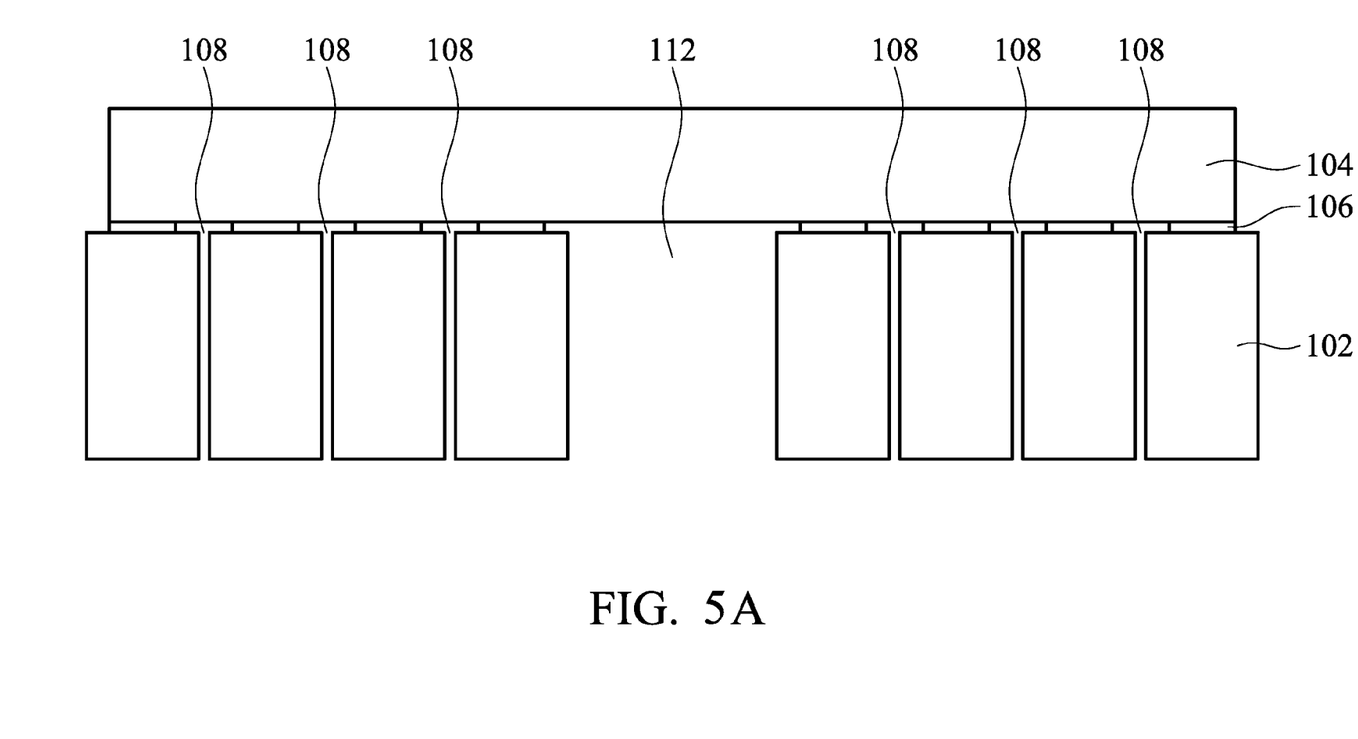
FIGS. 5A-5B is a cross-sectional view along line 5-5 in FIG. 4 in accordance with some embodiments of the present disclosure.

In addition, FIG. 5A is a cross-sectional view along line 5-5 in FIG. 4 in accordance with one embodiment of the present disclosure. In the embodiment shown in FIG. 5A, the trench 108 and the through-hole 112 completely penetrate through the flexible substrate 102.

Figure 5B:
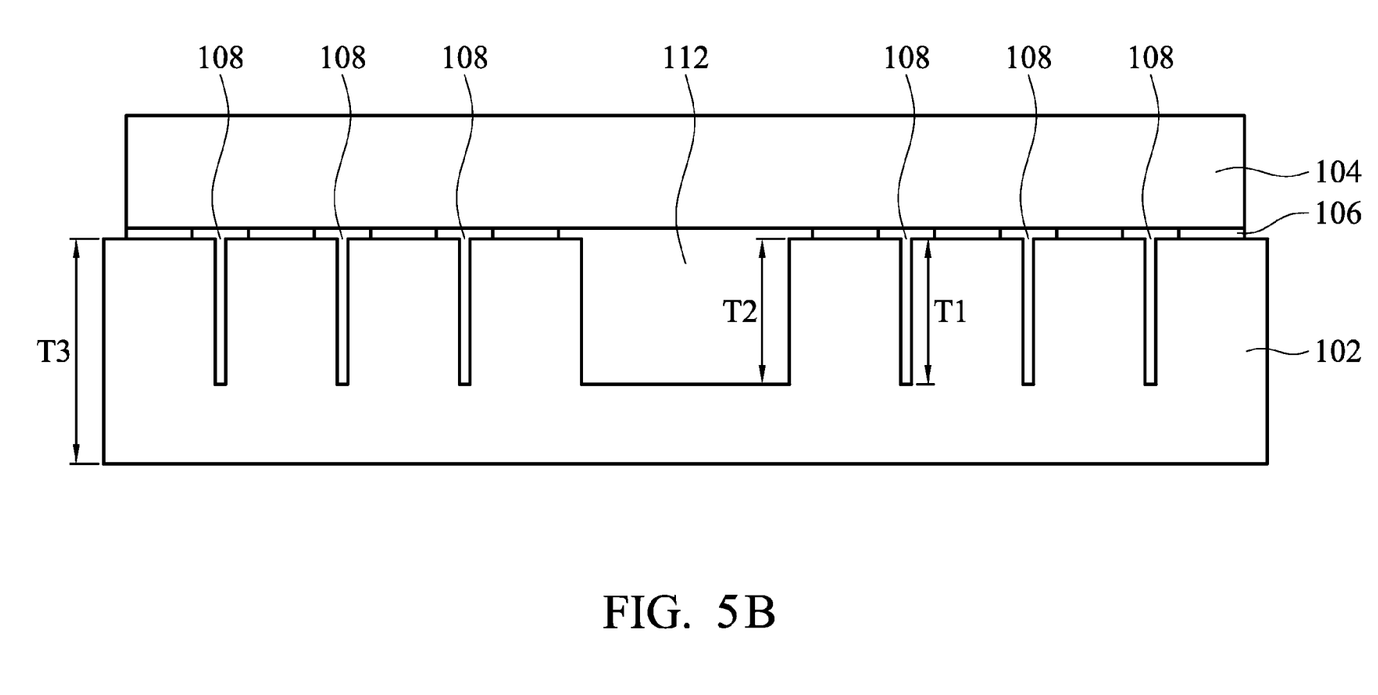

FIG. 5B is a cross-sectional view along line 5-5 in FIG. 4 in accordance with another embodiment of the present disclosure. In the embodiment shown in FIG. 5B, the trench 108 and the through-hole 112 partially extend into the flexible substrate 102. In addition, in this embodiment, the depth T1 of the trench 108 is the same with the depth T2 of the through-hole 112. However, in other embodiments, the depth T1 of the trench 108 may be different from the depth T2 of the through-hole 112. The depth T1 of the trench 108 may be about 0.5 to 0.9 times the thickness T3 of the flexible substrate 102, for example from about 0.6 to 0.8 times. The depth T2 of the through-hole 112 may also be about 0.5 to 0.9 times the thickness T3 of the flexible substrate 102, for example from about 0.6 to 0.8 times. It should be noted that, if the depth T1 of the trench 108 or the depth T2 of the through-hole 112 is too small, for example smaller than 0.5 times the thickness T3 of the flexible substrate 102, the trench 108 or the through-hole 112 cannot effectively release the thermal stress resulted in due to the different thermal expansion coefficients of the flexible substrate 102 and the chip 104 in the heating steps.

Figure 6:
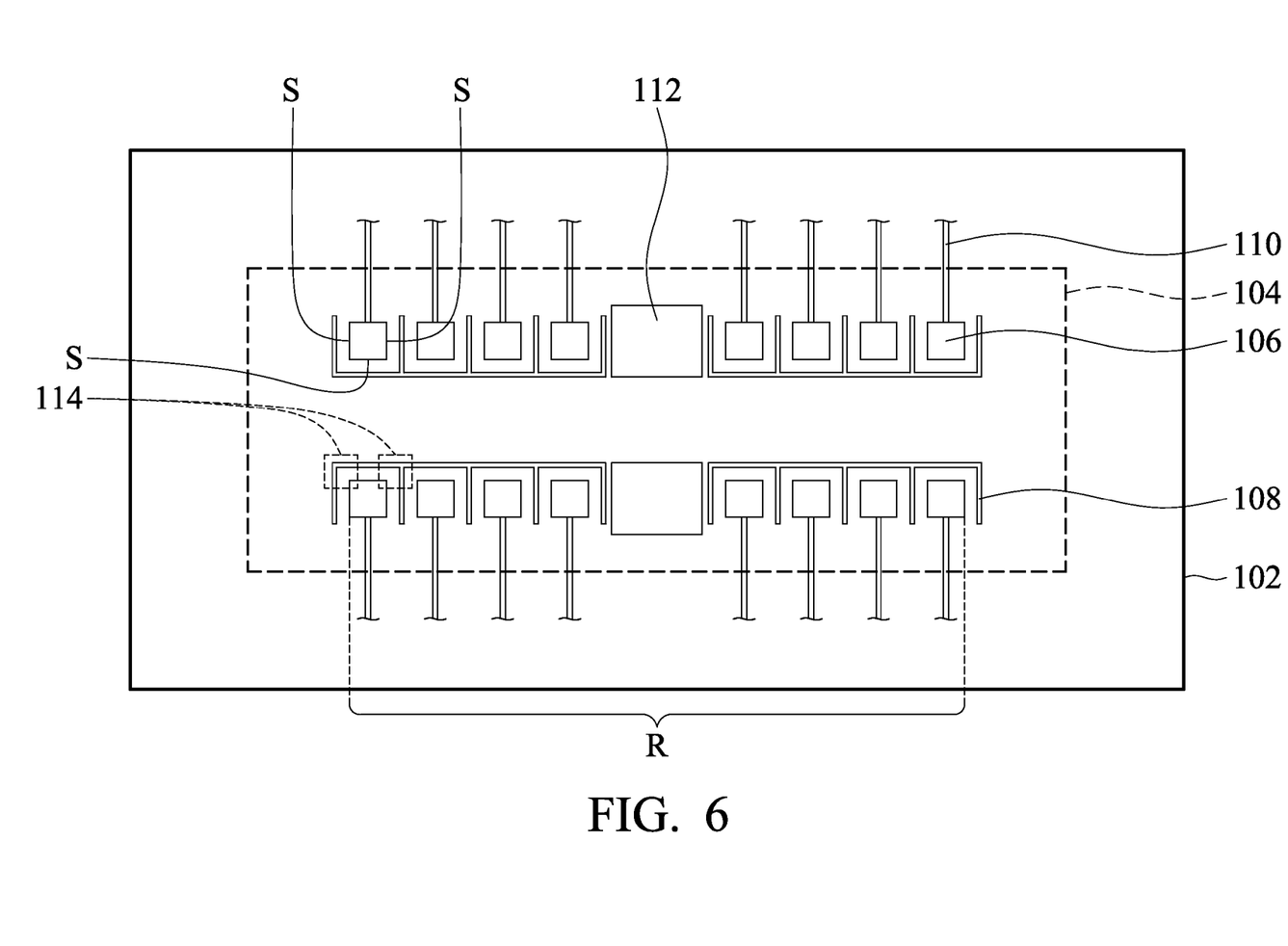
FIG. 6 is a top view of a flexible microsystem structure in accordance with another embodiment of the present disclosure.
Figure 7:
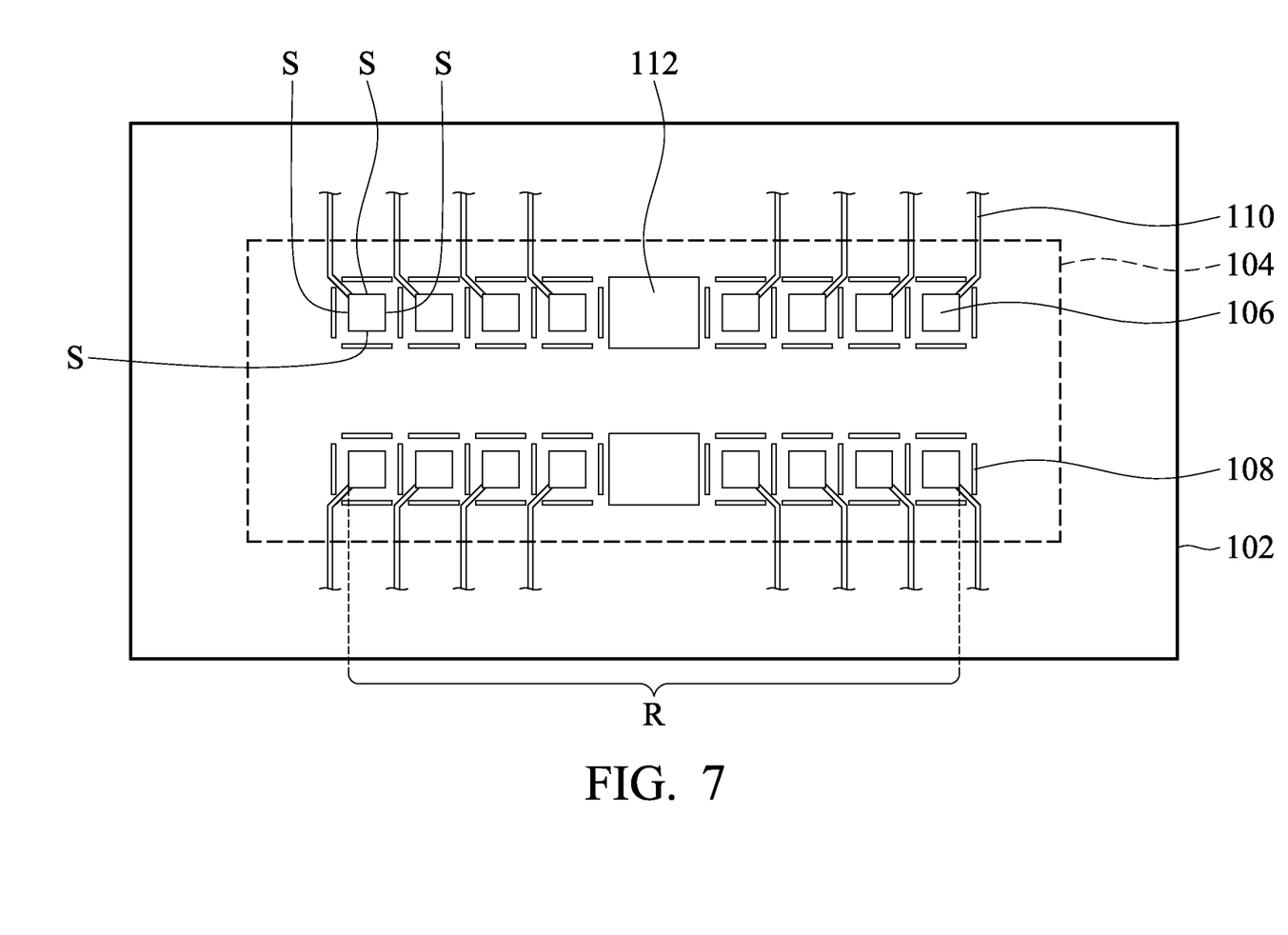
FIG. 7 is a top view of a flexible microsystem structure in accordance with another embodiment of the present disclosure.

It should be noted that, although only the cross-sectional view of FIG. 4 (namely FIGS. 5A and 5B) is used to describe that the trench 108 and the through-hole 112 may completely penetrate through the flexible substrate 102 or may partially extend into the flexible substrate 102, those skilled in the art will appreciate that the trench 108 and the through-hole 112 may also completely penetrate through the flexible substrate 102 or partially extend into the flexible substrate 102 in the embodiments shown in FIGS. 1-3 and subsequent FIGS. 6-7. These features are not limited to the embodiments shown in FIGS. 4 and 5A-5B.

FIG. 6 is a top view of a flexible microsystem structure in accordance with another embodiment of the present disclosure. The difference between the embodiment shown in FIG. 6 and the embodiments shown in FIGS. 3-4 is that the plurality of the trenches 108 are disposed along three sides S of each of the bonding elements 106, and is disposed along only these three sides S of the bonding elements 106. In this embodiment, since the amount of the trenches 108 around one bonding element 106 increases, the flexible microsystem structure 100 shown in FIG. 6 may further release the thermal stress resulted in due to the different thermal expansion coefficients of the flexible substrate 102 and the chip 104 in the heating steps. Therefore, the inflatedness, bending and curl of the flexible substrate 102 resulted after the heating steps may be further reduced.

In addition, in the embodiment shown in FIG. 6, three of the trenches 108 disposed along the three sides S of one bonding element 106 may connect to each other. The three trenches 108 which connect to each other may further release the thermal stress at the corner 114 of the bonding element 106. Therefore, the inflatedness, bending and curl of the flexible substrate 102 resulted after the heating steps may be further reduced.

FIG. 7 is a top view of a flexible microsystem structure in accordance with another embodiment of the present disclosure. The difference between the embodiment shown in FIG. 7 and the embodiment shown in FIG. 6 is that the plurality of the trenches 108 are disposed along four sides S of each of the bonding elements 106. In addition, at least two of the four trenches 108 disposed along the four sides S of one bonding element 106 do not connect to each other. In this embodiment, since the amount of the trenches 108 around one bonding element 106 increases, the flexible microsystem structure 100 shown in FIG. 7 may further release the thermal stress resulted in due to the different thermal expansion coefficients of the flexible substrate 102 and the chip 104 in the heating steps. Therefore, the inflatedness, bending and curl of the flexible substrate 102 resulted after the heating steps may be further reduced.

It should be noted that, although FIGS. 1-7 shows only two bonding element rows R disposed under the chip 104 and eight bonding elements 106 in each of the bonding element row R, those skilled in the art will appreciate that more than two bonding element rows R may be disposed under the chip 104, and the number of bonding elements 106 in each of the bonding element row R may also be other than eight. In addition, the bonding elements 106 may be configured by any other suitable configuration. Furthermore, although some embodiments of the present disclosure and their advantages have been described in FIGS. 1-7, those skilled in the art will appreciate that any device having a trench 108 disposed along any side S of any bonding element 106 by any configuration will fall into the scope of the present application. In other words, although every bonding element 106 has at least one trench 108 beside it in the embodiments shown in FIGS. 1-7, it is not necessary to dispose the trench 108 beside every single bonding element 106. In addition, every independent trench 108 in FIGS. 1-7 may be connected to each other according to design requirements. Therefore, the exemplary embodiments set forth in FIGS. 1-7 is merely for the purpose of illustration, and the inventive concept may be embodied in various forms without being limited to the exemplary embodiments as shown in FIGS. 1-7.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A flexible microsystem structure, comprising:
a flexible substrate; and
a chip disposed over the flexible substrate, wherein the chip is bonded to the flexible substrate by a plurality of bonding elements disposed over the flexible substrate;
wherein the flexible substrate has at least one trench disposed under the chip and disposed along at least one side of at least one of the bonding elements, wherein a width of the trench is smaller than a width of the bonding element.

2. The flexible microsystem structure as claimed in claim 1, wherein the trench partially extends into the flexible substrate.

3. The flexible microsystem structure as claimed in claim 1, wherein the trench completely penetrates through the flexible substrate.

4. The flexible microsystem structure as claimed in claim 1, wherein the flexible substrate has a plurality of the trenches, and the plurality of the trenches is disposed along only one side of each of the bonding elements.

5. The flexible microsystem structure as claimed in claim 1, wherein the flexible substrate has a plurality of the trenches, and the plurality of the trenches is disposed along only two sides of each of the bonding elements.

6. The flexible microsystem structure as claimed in claim 1, wherein the flexible substrate has a plurality of the trenches, and the plurality of the trenches is disposed along only three sides of each of the bonding elements.

7. The flexible microsystem structure as claimed in claim 6, wherein three of the trenches disposed along the three sides of one bonding element connect to each other.

8. The flexible microsystem structure as claimed in claim 1, wherein the flexible substrate has a plurality of the trenches, and the plurality of the trenches is disposed along four sides of each of the bonding elements, wherein at least two of the four trenches disposed along four sides of one bonding element do not connect to each other.

9. The flexible microsystem structure as claimed in claim 1, wherein the plurality of bonding elements is juxtaposed with each other.

10. The flexible microsystem structure as claimed in claim 1, wherein the flexible substrate further comprises a through-hole disposed between the plurality of bonding elements.

11. The flexible microsystem structure as claimed in claim 1, wherein the width of the trench is about 0.1 to 0.3 times the width of the bonding element.

12. The flexible microsystem structure as claimed in claim 1, wherein a length of the trench is about 0.8 to 1.5 times a length of the bonding element.

13. The flexible microsystem structure as claimed in claim 1, wherein the bonding element comprises a conductive pad, a conductive pillar, a conductive bump or a solder ball.

* * * * *